(12) United States Patent
Ota

(10) Patent No.: US 10,312,024 B2
(45) Date of Patent: Jun. 4, 2019

(54) MULTILAYER CERAMIC ELECTRONIC COMPONENT

(71) Applicant: Murata Manufacturing Co., Ltd., Nagaokakyo-shi, Kyoto-fu (JP)

(72) Inventor: Yutaka Ota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 290 days.

(21) Appl. No.: 15/365,169

(22) Filed: Nov. 30, 2016

(65) Prior Publication Data

US 2017/0162329 A1 Jun. 8, 2017

(30) Foreign Application Priority Data

Dec. 3, 2015 (JP) ................................. 2015-236327

(51) Int. Cl.
*H01L 41/04* (2006.01)
*H01G 4/30* (2006.01)
(Continued)

(52) U.S. Cl.
CPC ............... *H01G 4/30* (2013.01); *H01C 1/148* (2013.01); *H01C 7/008* (2013.01); *H01C 7/18* (2013.01);
(Continued)

(58) Field of Classification Search
CPC ............ H01L 41/0471; H01L 41/0472; H01L 41/083; H01L 41/1871; H01L 41/1876
(Continued)

(56) References Cited

U.S. PATENT DOCUMENTS 5,721,464 A * 2/1998 Dibbern ............... H01L 41/083
310/358
2011/0187239 A1* 8/2011 Feiel ................... H01L 41/0472
310/366

(Continued)

FOREIGN PATENT DOCUMENTS

JP 62-135427 U 8/1987
JP 8-69938 A 3/1996
(Continued)

OTHER PUBLICATIONS

Official Communication issued in corresponding Korean Patent Application No. 10-2016-0154833, dated Oct. 24, 2017.

*Primary Examiner* — Derek J Rosenau
(74) *Attorney, Agent, or Firm* — Keating & Bennett, LLP

(57) ABSTRACT

A multilayer ceramic capacitor includes a multilayer body including ceramic layers and including main surfaces, side surfaces, and end surfaces, inner electrodes, which are located inside the multilayer body and a portion of each of which extends to one main surface, and outer electrodes located on one main surface and connected to the inner electrodes. Each of the outer electrodes includes outer electrode side surface portions located up to a portion of each of the side surfaces and an outer electrode end surface portion located up to one end surface, and about $1.40 \leq A/B \leq $ about 3.33 is satisfied, where the lengths of the outer electrode side surface portions in the direction in which the main surfaces are connected are indicated as A and the lengths of the outer electrode end surface portions in the direction in which the main surfaces are connected are indicated as B.

18 Claims, 7 Drawing Sheets

(51) Int. Cl.
- *H01G 4/232* (2006.01)
- *H01C 7/00* (2006.01)
- *H01C 1/148* (2006.01)
- *H01C 7/18* (2006.01)
- *H01F 17/00* (2006.01)
- *H01F 17/04* (2006.01)
- *H01F 27/29* (2006.01)
- *H01G 2/06* (2006.01)
- *H01G 4/012* (2006.01)
- *H01L 41/047* (2006.01)
- *H01G 4/12* (2006.01)

(52) U.S. Cl.
CPC ......... *H01F 17/0013* (2013.01); *H01F 17/04* (2013.01); *H01F 27/292* (2013.01); *H01G 2/065* (2013.01); *H01G 4/012* (2013.01); *H01G 4/232* (2013.01); *H01G 4/2325* (2013.01); *H01L 41/0472* (2013.01); *H01G 4/12* (2013.01)

(58) Field of Classification Search
USPC .......................................... 310/328, 365, 366
See application file for complete search history.

(56) References Cited

U.S. PATENT DOCUMENTS

2012/0236461 A1    9/2012  Yamamoto et al.
2014/0292141 A1*  10/2014  Nishisaka ........... H01F 17/0013
                                                            310/311

FOREIGN PATENT DOCUMENTS

| JP | 10-208979 A   | 8/1998  |
| JP | 10-289837 A   | 10/1998 |
| JP | 2011-228326 A | 11/2011 |
| KR | 10-1418453 B1 | 7/2014  |
| KR | 10-1446189 B1 | 10/2014 |

* cited by examiner

MULTILAYER CERAMIC ELECTRONIC COMPONENT

CROSS REFERENCE TO RELATED APPLICATIONS

This application claims the benefit of priority to Japanese Patent Application No. 2015-236327 filed on Dec. 3, 2015. The entire contents of this application are hereby incorporated herein by reference.

BACKGROUND OF THE INVENTION

1. Field of the Invention

The present invention relates to a multilayer ceramic electronic component, for example, a multilayer ceramic capacitor.

2. Description of the Related Art

In recent years, mobile electronic equipment has been reduced in size. Many multilayer ceramic electronic components are mounted in the mobile electronic equipment. As the mobile electronic equipment is reduced in size, size reduction of multilayer ceramic electronic components is also required. Further, the multilayer ceramic electronic component, in which outer electrodes are located on both end surfaces of a multilayer body having inner electrodes, needs to be provided with a solder fillet, which extends like the foot of a mountain, between the outer electrodes and a wiring pattern so as to be mounted onto the wiring pattern of a circuit board. Consequently, it is necessary that a large wiring pattern be formed so as to include the area of the solder fillet outside the end surface of the multilayer ceramic electronic component. Therefore, the space for mounting the multilayer ceramic electronic component increases. However, as the mobile electronic equipment is reduced in size, in addition to size reduction of the multilayer ceramic electronic components, it is also required to decrease the space for mounting by decreasing the mounting interval between the components to be mounted on the circuit board.

Then, as shown in FIG. 7, in a multilayer ceramic electronic component 1, inner electrodes 2 are formed so as to become perpendicular or substantially perpendicular to a surface to be mounted onto the circuit board, and inner electrodes 2 extend to the outer electrodes 3 formed on the mounting surface. The above-described multilayer ceramic electronic component 1 can be mounted onto the wiring pattern of the circuit board by using the outer electrodes 3 formed on one mounting surface. Therefore, the solder fillets that extend outward from the end portions of the outer electrodes are not necessary, and the space for mounting the multilayer ceramic electronic component 1 can be decreases (refer to Japanese Unexamined Patent Application Publication No. 10-289837).

In addition, as described in Japanese Unexamined Utility Model Registration Application Publication No. 62-135427, a multilayer ceramic electronic component, in which not only outer electrodes are located on the mounting surface but also the outer electrodes are located on the surfaces orthogonal to the mounting surface, has been located.

However, it is difficult for the multilayer ceramic electronic components having the shapes described in Japanese Unexamined Patent Application Publication No. 10-289837 and Japanese Unexamined Utility Model Registration Application Publication No. 62-135427 to sufficiently suppress the inclination of the multilayer ceramic electronic components because of, for example, the stress in wetting and solidification of the solder during mounting. Consequently, in some cases, the multilayer ceramic electronic component is inclined after mounting and, as a result, there is a problem associated with appearance and there is a problem that fixing strength is reduced in a certain direction.

SUMMARY OF THE INVENTION

According to a preferred embodiment of the present invention, inclination of a multilayer ceramic electronic component is able to be significantly reduced or prevented during mounting of the component onto a circuit board.

According to a preferred embodiment of the present invention, a multilayer ceramic electronic component includes a multilayer body including a plurality of stacked ceramic layers and including a first main surface and a second main surface opposite to each other, a first side surface and a second side surface opposite to each other in a stacking direction, and a first end surface and a second end surface opposite to each other, the first main surface or the second main surface defining and functioning as a mounting surface, first inner electrodes, which are located inside the multilayer body and a portion of each of which extends to only one surface of the first and second main surfaces on the first end surface side, second inner electrodes, which are located inside the multilayer body and a portion of each of which extends to only one surface of the first and second main surfaces on the second end surface side, at a location different from the locations of the first inner electrodes, a first outer electrode located on the first or second main surface and connected to the first inner electrodes, and a second outer electrode located on the first or second main surface and connected to the second inner electrodes, wherein the first outer electrode includes first outer electrode side surface portions located from the first or second main surface to a portion of each of the first side surface and the second side surface and a first outer electrode end surface portion located from the first or second main surface to a portion of the first end surface, the second outer electrode includes second outer electrode side surface portions located from the first or second main surface to a portion of each of the first side surface and the second side surface and a second outer electrode end surface portion located from the first or second main surface to a portion of the second end surface, and about 1.40≤A/B≤about 3.33 is satisfied, where the lengths of the first outer electrode side surface portions and the second outer electrode side surface portions in the direction in which the first main surface and the second main surface are connected are indicated as A and the lengths of the first outer electrode end surface portion and the second outer electrode end surface portion in the direction in which the first main surface and the second main surface are connected are indicated as B.

In addition, according to a preferred embodiment of the present invention, a multilayer ceramic electronic component includes a multilayer body including a plurality of stacked ceramic layers and including a first main surface and a second main surface opposite to each other, a first side surface and a second side surface opposite to each other in a stacking direction, and a first end surface and a second end surface opposite to each other, the first main surface or the second main surface defining and functioning as a mounting surface, first inner electrodes, which are located inside the multilayer body and a portion of each of which extends to the first and second main surfaces on the first end surface side, second inner electrodes, which are located inside the multilayer body and a portion of each of which extends to the first and second main surfaces on the second end surface side, at locations different from the locations of the first inner electrodes, first outer electrodes located on the first and second main surfaces and connected to the first inner electrodes, and second outer electrodes located on the first and second main surfaces and connected to the second inner electrodes, wherein each of the first outer electrodes includes first outer electrode side surface portions located from the first or second main surfaces to a portion of each of the first side surface and the second side surface and a first outer electrode end surface portion located from the first or second main surface to a portion of the first end portion, each of the second outer electrodes includes second outer electrode side surface portions located from the first or second main surface to a portion of each of the first side surface and the second side surface and a second outer electrode end surface portion located from the first or second main surface to a portion of the second end surface, and about 1.40≤A/B≤about 3.33 is satisfied, where the lengths of the first outer electrode side surface portions and the second outer electrode side surface portions in the direction in which the first main surface and the second main surface are connected are indicated as A and the lengths of the first outer electrode end surface portions and the second outer electrode end surface portions in the direction in which the first main surface and the second main surface are connected are indicated as B.

In a multilayer ceramic electronic component according to preferred embodiments of the present invention, about 1.40≤A/B≤about 3.33 is satisfied, where the lengths of the first outer electrode side surface portions and the second outer electrode side surface portions in the direction in which the first main surface and the second main surface are connected are indicated as A and the lengths of the first outer electrode end surface portion and the second outer electrode end surface portion in the direction in which the first main surface and the second main surface are connected are indicated as B. Therefore, when mounting onto a circuit board is performed, the inclination of a multilayer ceramic electronic component is able to be significantly reduced or prevented because the mounting orientation is determined by a down force, which is applied during melting of a joining material during mounting, exerted on the multilayer ceramic capacitor 10.

The down force is influenced by the height of an electrode opposite to the mounting surface and, therefore, the mounting orientation is determined depending on the end surface or the side surface, which includes a larger electrode height. Here, if the height of the outer electrode side surface portion is larger than the height of the outer electrode end surface portion, the down force realized at four positions of the side surface increases and, therefore, the effect of the side surface, which provides the down force larger than the down force realized at two positions of the end surface, is increased and the inclination is able to be significantly reduced or prevented.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

1. Multilayer Ceramic Electronic Component (1) First Preferred Embodiment

Figure 1:
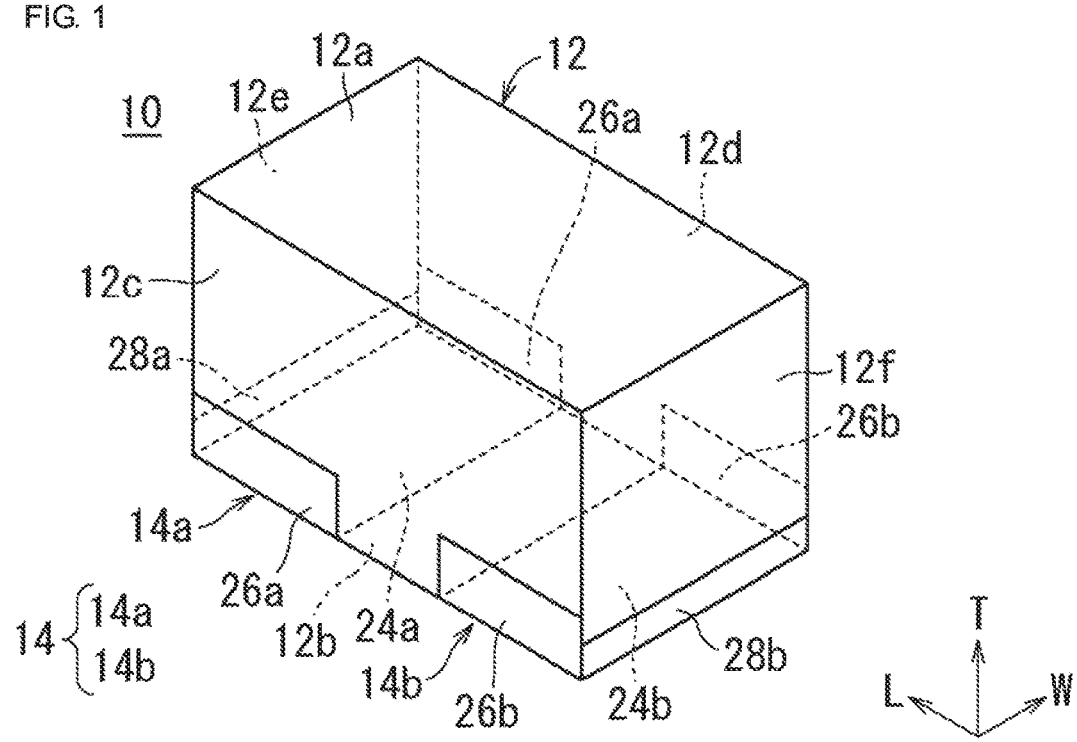
FIG. 1 is a perspective view of a multilayer ceramic capacitor according to a first preferred embodiment of the present invention.
Figure 2A:
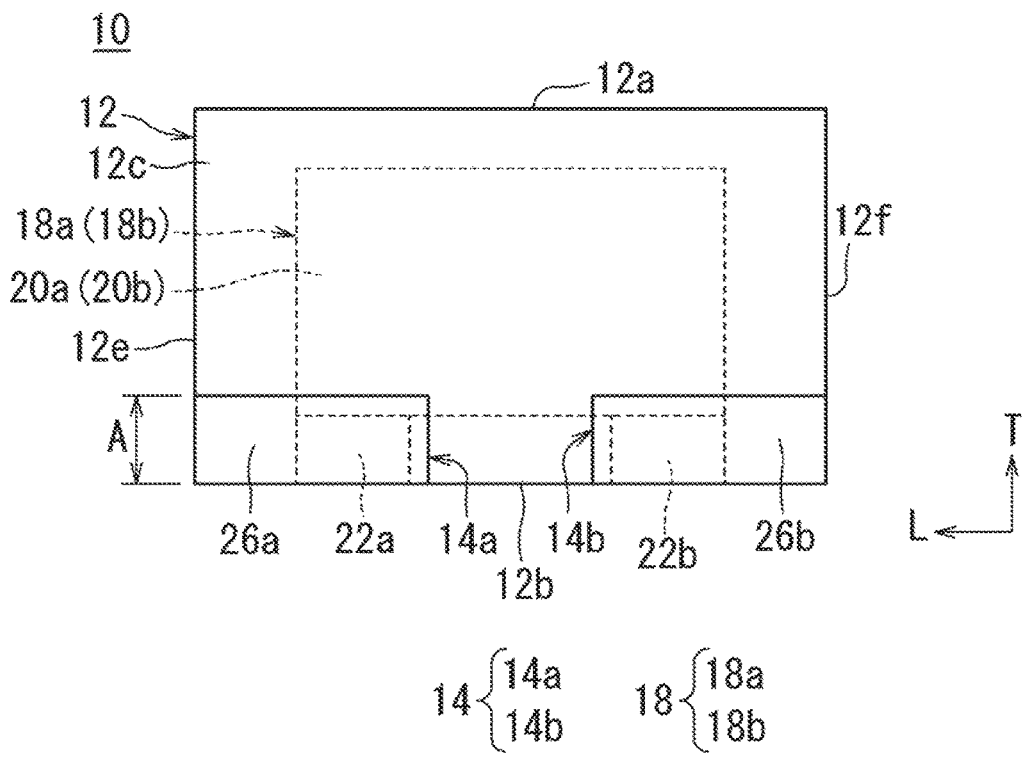
FIG. 2A is an elevational view of the multilayer ceramic capacitor shown in FIG. 1.
Figure 2B:
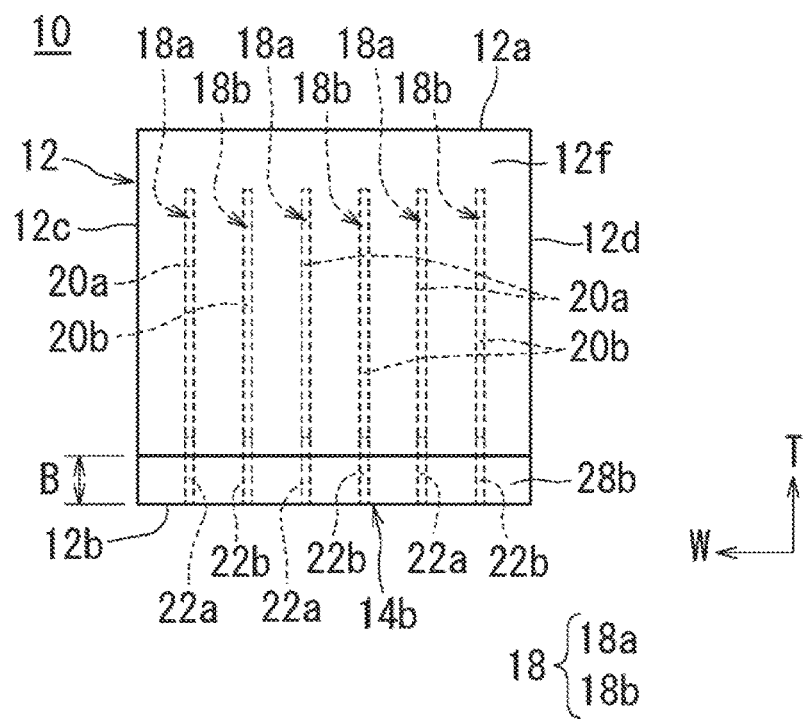
FIG. 2B is a side view of the multilayer ceramic capacitor shown in FIG. 1.
Figure 3:
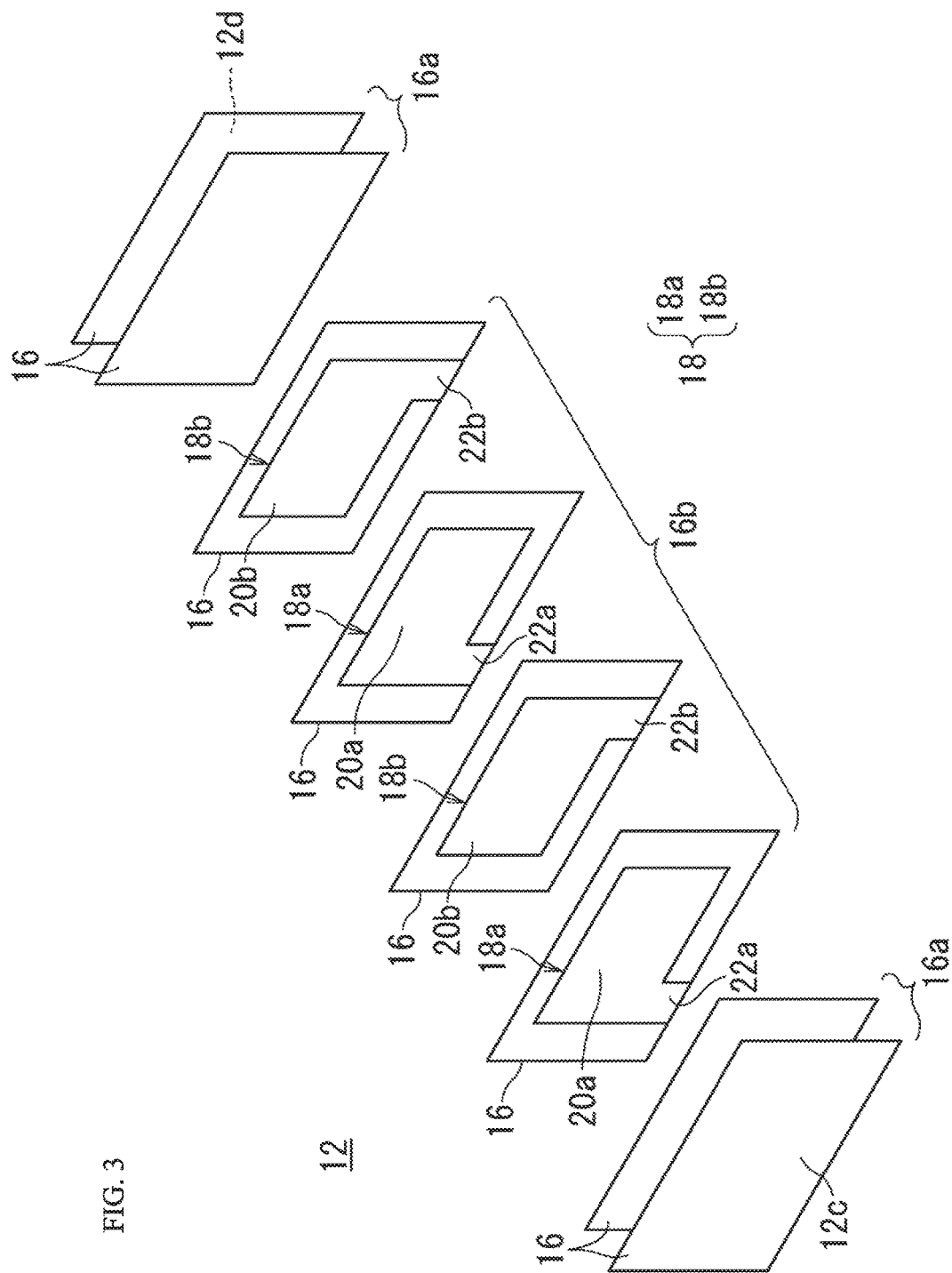
FIG. 3 is an exploded perspective view of the multilayer body shown in FIG. 1 and FIGS. 2A and 2B.

A multilayer ceramic electronic component according to a first preferred embodiment of the present invention is described below. In the first preferred embodiment, a multilayer ceramic capacitor is shown as an example of the multilayer ceramic electronic component. FIG. 1 is a perspective view of a multilayer ceramic capacitor according to the first preferred embodiment of the present invention. FIG. 2A is an elevational view of the multilayer ceramic capacitor shown in FIG. 1, and FIG. 2B is a side view. FIG. 3 is an exploded perspective view of the multilayer body shown in FIG. 1 and FIGS. 2A and 2B.

A multilayer ceramic capacitor 10 includes a rectangular or substantially rectangular parallelepiped multilayer body 12 and an outer electrode 14.

The multilayer body 12 includes a plurality of ceramic layers 16 and a plurality of inner electrodes 18. The multilayer body 12 includes a first main surface 12a and a second main surface 12b opposite to each other, a first side surface 12c and a second side surface 12d opposite to each other in a stacking direction, and a first end surface 12e and a second end surface 12f opposite to each other. Each of the first main surface 12a and the second main surface 12b extends in a length direction L and a width direction W. Each of the first side surface 12c and the second side surface 12d extends in the length direction L and a thickness direction T. Each of the first end surface 12e and the second end surface 12f extends in the width direction W and the thickness direction T. The first main surface 12a and the second main surface 12b are surfaces parallel or substantially parallel to the surface (mounting surface) on which the multilayer ceramic capacitor 10 is mounted. Therefore, the length direction L refers to the direction of bonding of a pair of end surfaces, the width direction W refers to the direction of bonding of a pair of side surfaces, and the thickness direction T refers to the direction of bonding of a pair of main surfaces.

The corner portions and the ridges of the multilayer body 12 are preferably rounded, for example. The corner portion refers to the portion at which three surfaces of the multilayer body 12 intersect, and the ridge refers to the portion at which two surfaces of the multilayer body 12 intersect.

The ceramic layers 16 include outer layer portions 16a and an inner layer portion 16b. The outer layer portions 16a include the first side surface 12c and the second side surface 12d of the multilayer body 12, the ceramic layer 16 located between the first side surface 12c and the inner electrode 18 nearest to the first side surface 12c, and the ceramic layer 16 located between the second side surface 12d and the inner electrode 18 nearest to the second side surface 12d. The thickness of the outer layer portion 16a is preferably about 18 μm or more. The region located between the two outer layer portions 16a is the inner layer portion 16b.

The ceramic layer 16 includes, for example, a dielectric material. More specifically, the dielectric material preferably includes, for example, a dielectric ceramic including a component, for example, $BaTiO_3$, $CaTiO_3$, $SrTiO_3$, or $CaZrO_3$. If the above-described dielectric material is included as a primary component, a secondary component, for example, a Mn compound, an Fe compound, a Cr compound, a Co compound, or a Ni compound, may preferably be added in an amount smaller than that of the primary component in accordance with the predetermined characteristics of the multilayer ceramic capacitor 10.

If a piezoelectric ceramic is included in the multilayer body 12, the multilayer ceramic electronic component defines and functions as a ceramic piezoelectric element. Specific examples of the piezoelectric ceramic materials include lead zirconate titanate (PZT)-based ceramic materials.

If a semiconductor ceramic is included in the multilayer body 12, the multilayer ceramic electronic component defines and functions as a thermistor element. Specific examples of the semiconductor ceramic materials include spinel-based ceramic materials.

If a magnetic ceramic is included in the multilayer body 12, the multilayer ceramic electronic component defines and functions as an inductor element. If the multilayer ceramic electronic component defines and functions as the inductor element, the inner electrode 18 is a coil conductor. Specific examples of the magnetic ceramic materials include ferrite ceramic materials.

The thickness of the ceramic layer 16 after firing is preferably about 0.5 μm or more and about 2 μm or less, for example.

As shown in FIGS. 2A and 2B and FIG. 3, the multilayer body 12 includes a plurality of inner electrodes 18 including a plurality of first inner electrodes 18a and a plurality of second inner electrodes 18b. Each of the first inner electrodes 18a includes a first opposite electrode portion 20a, which is opposite to the first side surface 12c and the second side surface 12d, and is stacked in the direction in which the first side surface 12c and the second side surface 12d are connected. Each of the second inner electrodes 18b includes a second opposite electrode portion 20b, which is opposite to the first side surface 12c and the second side surface 12d, and is stacked in the direction in which the first side surface 12c and the second side surface 12d are connected. The first inner electrodes 18a and the second inner electrodes 18b are perpendicular or substantially perpendicular to the first main surface 12a and the second main surface 12b. The first inner electrodes 18a and the second inner electrodes 18b are alternately stacked in the multilayer body 12, and the first opposite electrode portion 20a of the first inner electrode 18a and the second opposite electrode portion 20b of the second inner electrode 18b are opposed to each other.

Auxiliary electrodes may be located in the layer in which the first inner electrode 18a is located and the layer in which the second inner electrode 18b is located.

The first inner electrode 18a extends to the second main surface 12b of the multilayer body 12 by a first extending electrode portion 22a. The first extending electrode portion 22a extends to the first end surface 12e side of the multilayer body 12. The second inner electrode 18b extends to the second main surface 12b of the multilayer body 12 by a second extending electrode portion 22b. The second extending electrode portion 22b extends to the second end surface 12f side of the multilayer body 12 while maintaining a distance from the first extending electrode portion 22a. Neither the first inner electrode 18a nor the second inner electrode 18b is exposed at the first main surface 12a, the two side surfaces 12c and 12d, and the two end surfaces 12e and 12f.

A portion of the first inner electrode 18a may extend to the first end surface 12e, and a portion of the second inner electrode 18b may extend to the second end surface 12f.

The first extending electrode portion 22a of the first inner electrode 18a may extend to only the first main surface 12a. Correspondingly, the second extending electrode portion 22b of the second inner electrode 18b extends to only the first main surface 12a.

The multilayer body 12 includes side portions (gaps) of the multilayer body 12 formed between one end in the length direction L of the first opposite electrode portion 20a and the first end surface 12e and between the other end in the length direction L of the first opposite electrode portion 20a and the second end surface 12f. Likewise, the multilayer body 12 includes side portions (gaps) of the multilayer body 12 formed between one end in the length direction L of the second opposite electrode portion 20b and the first end surface 12e and between the other end in the length direction L of the second opposite electrode portion 20b and the second end surface 12f.

The multilayer body 12 further includes end portions (gaps) of the multilayer body 12 formed between the end portion on the opposite side of the first extending electrode portion 22a of the first inner electrode 18a and the first main surface 12a and between the end portion on the opposite side of the second extending electrode portion 22b of the second inner electrode 18b and the first main surface 12a.

The material for forming the first inner electrode 18a and the second inner electrode 18b may preferably include, for example, a metal, e.g., Ni, Cu, Ag, Pd, or Au, or an alloy, e.g., an Ag—Pd alloy, including at least one of these metals. The first inner electrode 18a and the second inner electrode 18b may further include dielectric particles including the same or a similar composition as the ceramic included in the ceramic layer 16. The thickness of each of the first inner electrode 18a and the second inner electrode 18b is preferably about 0.1 μm or more and about 2.0 μm or less, for example.

The outer electrode 14 is located on the second main surface 12b of the multilayer body 12. The outer electrode 14 includes a first outer electrode 14a electrically connected to the first extending electrode portions 22a and a second outer electrode 14b electrically connected to the second extending electrode portions 22b.

In the multilayer body 12, the ceramic layer 16 is located between the first opposite electrode portion 20a and the second opposite electrode portion 20b, which are opposed to each other. Accordingly, electrical characteristics (for example, electrostatic capacity) are provided. Accordingly, the electrostatic capacity is able to be obtained between the first outer electrode 14a connected to the first inner electrode 18a and the second outer electrode 14b connected to the second inner electrode 18b. Therefore, the multilayer ceramic electronic component including the structure described above defines and functions as a capacitor.

The first outer electrode 14a includes a first outer electrode main surface portion 24a located on the second main surface 12b, first outer electrode side surface portions 26a that extend from the first outer electrode main surface portion 24*a* to each of the first side surface 12*c* and the second side surface 12*d*, and a first outer electrode end surface portion 28*a* that extends from the first outer electrode main surface portion 24*a* to the first end surface 12*e*.

The second outer electrode 14*b* includes a second outer electrode main surface portion 24*b* located on the second main surface 12*b*, second outer electrode side surface portions 26*b* that extend from the second outer electrode main surface portion 24*b* to each of the first side surface 12*c* and the second side surface 12*d*, and a second outer electrode end surface portion 28*b* that extends from the second outer electrode main surface portion 24*b* to the second end surface 12*f*.

The first outer electrode main surface portion 24*a* of the first outer electrode 14*a* extends along the first end surface 12*e* on the second main surface 12*b* of the multilayer body 12. The second outer electrode main surface portion 24*b* of the second outer electrode 14*b* extends along the second end surface 12*f* while maintaining a distance from the first outer electrode main surface portion 24*a*.

The lengths of the first outer electrode side surface portions 26*a* and the second outer electrode side surface portions 26*b* in the direction in which the first main surface 12*a* and the second main surface 12*b* are connected are greater than the lengths of the first outer electrode end surface portion 28*a* and the second outer electrode end surface portion 28*b* in the direction in which the first main surface 12*a* and the second main surface 12*b* are connected.

Preferably, about 1.40≤A/B≤about 3.33 is satisfied, for example, where the lengths of the first outer electrode side surface portions 26*a* and the second outer electrode side surface portions 26*b* in the direction in which the first main surface 12*a* and the second main surface 12*b* are connected are indicated as A, and the lengths of the first outer electrode end surface portion 28*a* and the second outer electrode end surface portion 28*b* in the direction in which the first main surface 12*a* and the second main surface 12*b* are connected are indicated as B.

The process for measuring the A dimension and the B dimension is as described below.

The appearance of the multilayer ceramic capacitor 10 is observed by a microscope and the heights of the central portions of the first outer electrode side surface portions 26*a* and the second outer electrode side surface portions 26*b* of the multilayer ceramic capacitor 10 in the length direction L (A dimension) and the heights of the central portions of the first outer electrode end surface portion 28*a* and the second outer electrode end surface portion 28*b* in the width direction W (B dimension) are measured by a dimension measurement operation. The A dimension is determined as an average of the values of the first outer electrode side surface portions 26*a* and the values of the second outer electrode side surface portions 26*b*. The B dimension is determined as an average of the value of the first outer electrode end surface portion 28*a* and the value of the second outer electrode end surface portion 28*b*.

The multilayer body 12 is set with the second main surface 12*b* down. Thus, the first side surface 12*c* is observed, a normal to the parallel or substantially parallel lines based on the first main surface 12*a* and the second main surface 12*b* is formed, and the length of the line, which is parallel or substantially parallel to the normal and which corresponds to the A dimension, is measured. Likewise, the multilayer body 12 is set with the second main surface 12*b* down. Thus, the first end surface 12*e* is observed, a normal to the parallel or substantially parallel lines based on the first main surface 12*a* and the second main surface 12*b* is formed, and the B dimension, which is parallel or substantially parallel to the normal, is measured.

The outer electrode 14 preferably includes an underlying electrode layer and a plating layer in this order from the multilayer body 12 side, for example. The underlying electrode layer includes at least one selected from a baking layer, a resin layer, a thin film layer, and the like, and an underlying electrode layer including the baking layer is described below.

The baking layer includes a glass and a metal. The metal for the baking layer preferably includes at least one selected from Cu, Ni, Ag, Pd, an Ag—Pd alloy, Au, and the like. The baking layer may include a plurality of layers. The baking layer is formed by coating the multilayer body 12 with an electrically conductive paste including a glass and a metal and baking. The baking layer may be formed by firing at the same or substantially the same time with the ceramic layer 16 and the inner electrode 18 or may be formed by baking after the ceramic layer 16 and the inner electrode 18 are fired. The thickness of the thickest portion in the baking layer is preferably about 10 μm or more and about 50 μm or less, for example.

The resin layer including electrically conductive particles and a thermosetting resin may be located on the surface of the baking layer. The resin layer may be formed directly on the multilayer body 12 without forming the baking layer. The resin layer may include a plurality of layers. The thickness of the thickest portion in the resin layer is preferably about 10 μm or more and about 150 μm or less, for example.

The thin film layer is formed by a thin film formation method, e.g., a sputtering method or an evaporation method, and is a layer of about 1 μm or less, for example in which metal particles are deposited.

Preferably, the plating layer includes plating of, for example, a metal selected from Cu, Ni, Sn, Pb, Au, Ag, Pd, Bi, Zn, and the like or an alloy including the metal.

The plating layer may include a plurality of layers. The plating layer preferably includes a two-layer structure including a first plating layer located on the surface of the baking layer and a second plating layer located on the second plating layer, for example.

Preferably, Ni is included in the first plating layer. If the inner electrode 18 includes Ni, preferably, Cu exhibiting good bondability to Ni is included in the first plating layer, for example.

The second plating layer may include a plurality of layers and preferably includes a two-layer structure including Ni plating and Sn plating. The Ni plating layer is included to significantly reduce or prevent solder leaching of the underlying electrode layer during mounting of the multilayer ceramic capacitor. The Sn plating layer is included to increase the wettability during mounting of the multilayer ceramic capacitor. Accordingly, the mounting is able to be easily performed. The second plating layer is located as desired, and the outer electrode 14 may include a plating layer, which is located directly on the multilayer body 12 and which is directly connected to the inner electrode 18, that is, the first plating layer. In a pretreatment, a catalyst may be provided on the multilayer body 12, for example.

The second plating layer may be located as an outermost layer of the plating layer, or another plating layer may be located on the surface of the second plating layer.

The thickness per layer of the plating layer is preferably about 1 μm or more and about 10 μm or less, for example. Preferably, the plating layer includes no glass. The proportion of the metal per unit volume of the plating layer is preferably about 99 percent by volume or more, for example. The plating layer is produced by grain growth in the thickness direction and includes a columnar or substantially columnar shape.

The dimension in the length direction L of the multilayer ceramic capacitor 10 is indicated as the L dimension, the dimension in the thickness direction T of the multilayer ceramic capacitor 10 including the multilayer body 12, the first outer electrode 14a, and the second outer electrode 14b is indicated as the T dimension, and the dimension in the width direction W of the multilayer ceramic capacitor 10 including the multilayer body 12, the first outer electrode 14a, and the second outer electrode 14b is indicated as the W dimension.

There is no particular limitation regarding the dimensions of the multilayer body 12, and preferably the L dimension in the length direction L is about 0.38 mm or more and about 3.50 mm or less, the W dimension in the width direction W is about 0.18 mm or more and 2.80 mm or less, and the T dimension in the thickness direction T is about 0.18 mm or more and about 2.80 mm or less, for example. The dimensions of the multilayer ceramic capacitor 10 are able to be measured by a microscope.

In the multilayer ceramic capacitor 10, the lengths of the first outer electrode side surface portions 26a and the second outer electrode side surface portions 26b in the direction in which the first main surface 12a and the second main surface 12b are connected are longer than the lengths of the first outer electrode end surface portion 28a and the second outer electrode end surface portion 28b in the direction in which the first main surface 12a and the second main surface 12b are connected. Therefore, when mounting on a circuit board or the like, the inclination of the multilayer ceramic capacitor 10 is able to be significantly reduced or prevented because the mounting orientation is determined by a down force, which is applied during melting of a joining material during mounting, exerted on the multilayer ceramic capacitor 10.

The down force is influenced by the height of an electrode opposite to the mounting surface and, therefore, the mounting orientation is determined depending on the end surface or the side surface, which includes a larger electrode height. Here, if the height of the outer electrode side surface portion is larger than the height of the outer electrode end surface portion, the down force applied at four positions of the side surface increases and, therefore, the effect of the side surface, which provides the down force larger than the down force applied at two positions of the end surface, is increased and the inclination is able to be significantly reduced or prevented.

As described above, regarding the multilayer ceramic capacitor 10, the orientation of the multilayer ceramic capacitor 10 during the mounting is able to be effectively controlled.

(2) Second Preferred Embodiment

Figure 4:
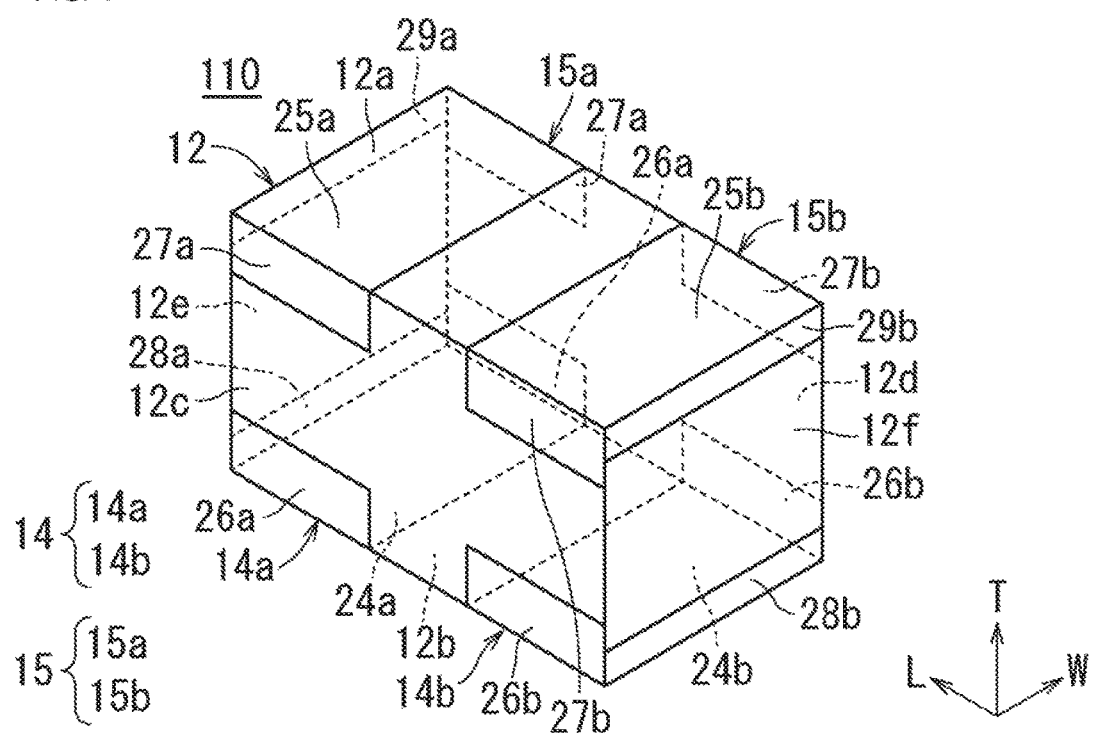
FIG. 4 is a perspective view of a multilayer ceramic capacitor according to a second preferred embodiment of the present invention.
Figure 5A:
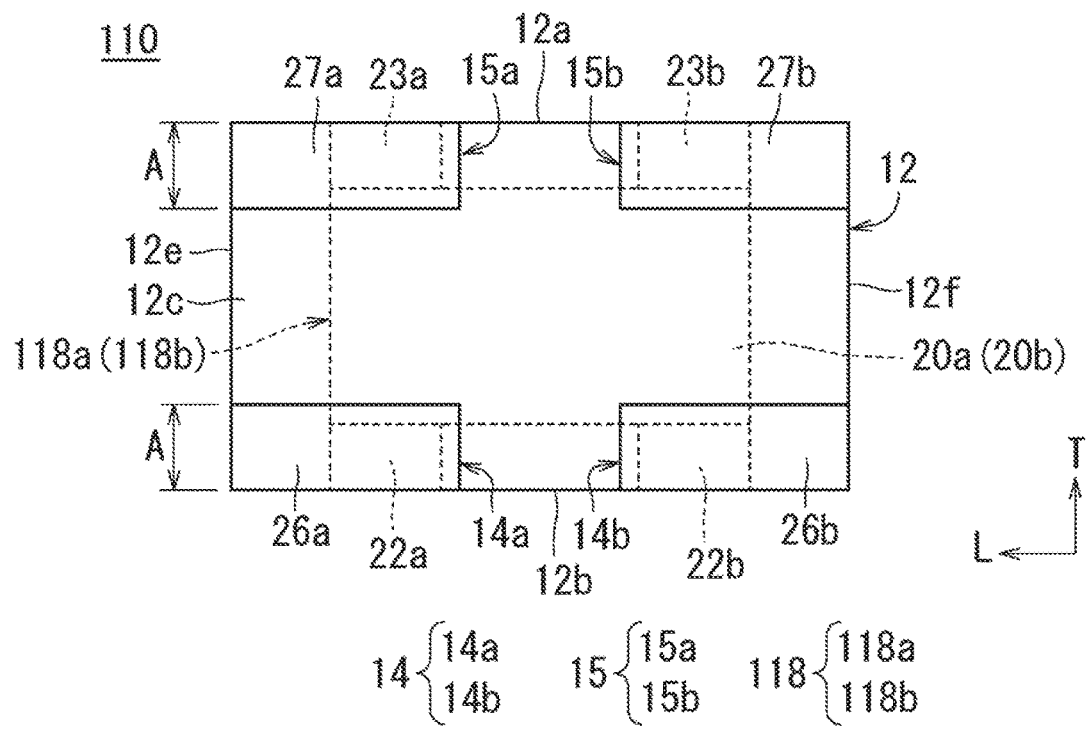
FIG. 5A is an elevational view of the multilayer ceramic capacitor shown in FIG. 4.
Figure 5B:
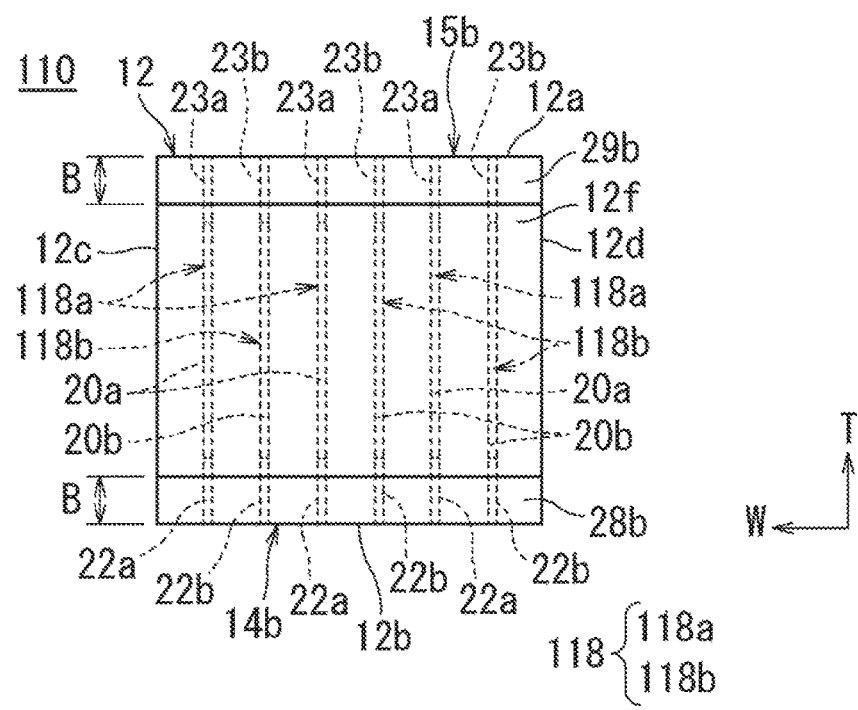
FIG. 5B is a side view.
Figure 6:
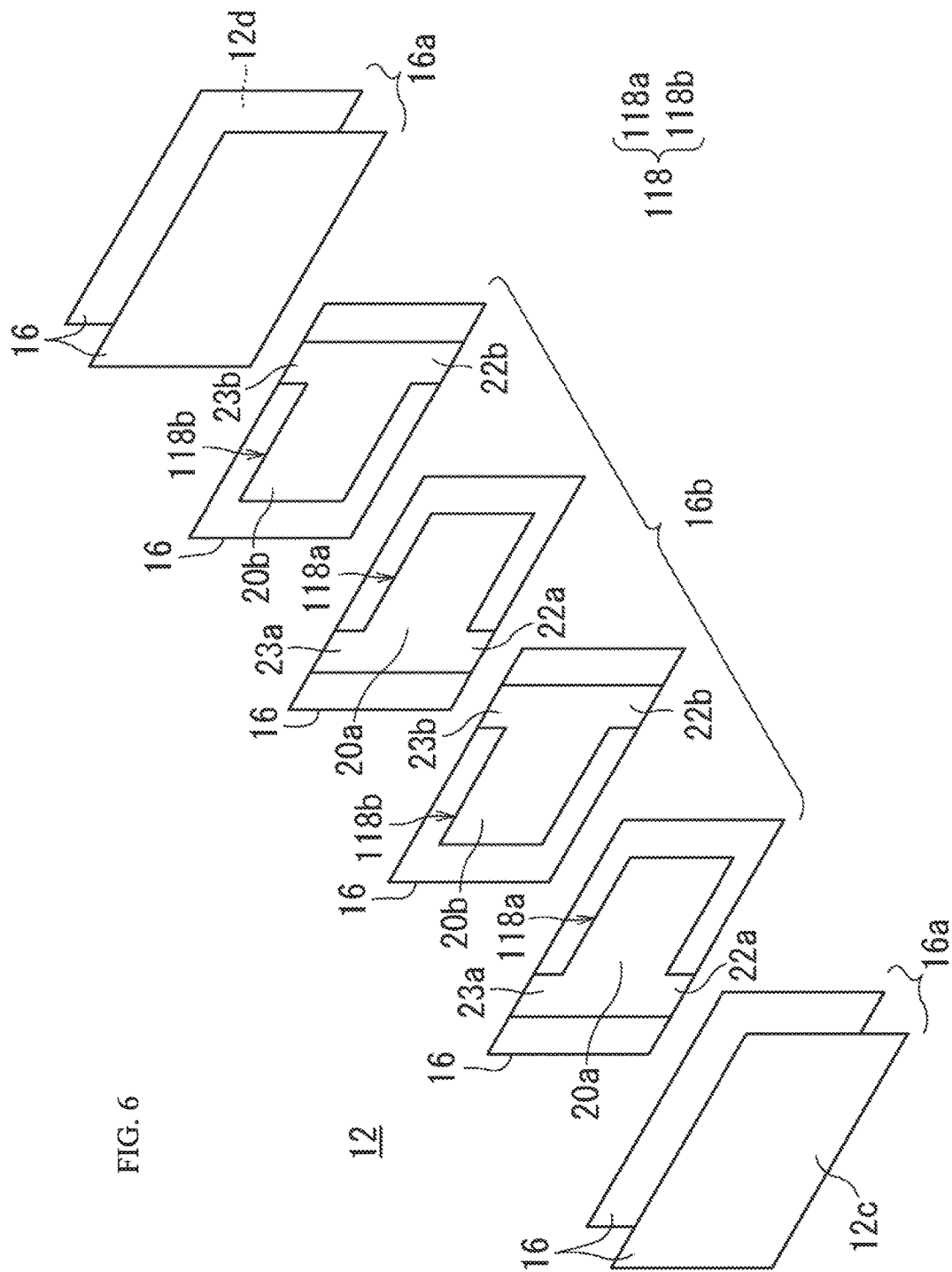
FIG. 6 is an exploded perspective view of the multilayer body shown in FIG. 4 and FIGS. 5A and 5B.
Figure 7:
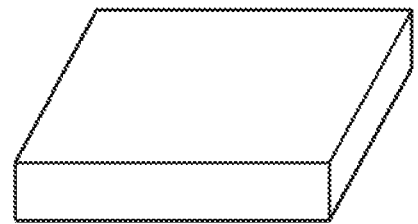
FIG. 7 is an exploded perspective view of a multilayer ceramic capacitor in the related art.
Figure 7:
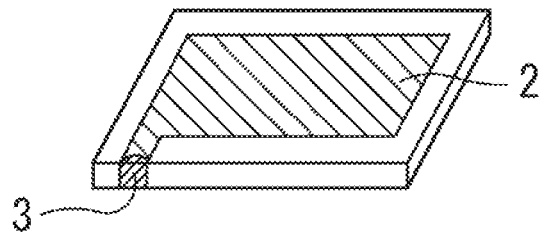
Figure 7:
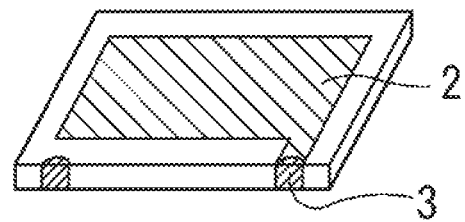
Figure 7:
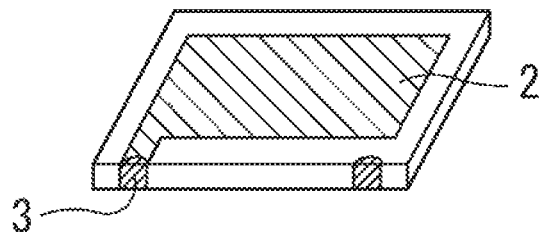
Figure 7:
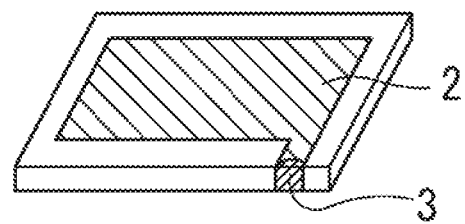
Figure 7:
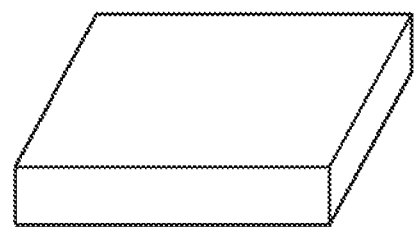

Next, a multilayer ceramic electronic component according to a second preferred embodiment of the present invention is described below. In the second preferred embodiment, a multilayer ceramic capacitor is shown as an example of the multilayer ceramic electronic component. FIG. 4 is a perspective view of a multilayer ceramic capacitor according to the second preferred embodiment of the present invention. FIG. 5A is an elevational view of the multilayer ceramic capacitor shown in FIG. 4, and FIG. 5B is a side view. FIG. 6 is an exploded perspective view of the multilayer body shown in FIG. 4 and FIGS. 5A and 5B. In the multilayer ceramic capacitor 110 shown in FIG. 4 to FIG. 6, the same or similar portions as the multilayer ceramic capacitor 10 shown in FIG. 1 to FIG. 3 are indicated by the same reference numerals as those described above, and the explanations thereof will not be provided.

The configuration of the multilayer ceramic capacitor 110 shown in FIG. 4 to FIG. 6 is different from the configuration of the multilayer ceramic capacitor 10 shown in FIG. 1 to FIG. 3 in that the inner electrode 118 extends to both main surfaces 12a and 12b and, therefore, an outer electrode 15 is located on the first main surface 12a.

The multilayer ceramic capacitor 110 includes a rectangular or substantially rectangular parallelepiped multilayer body 12 and outer electrodes 14 and 15.

The multilayer body 12 includes a plurality of ceramic layers 16 and a plurality of inner electrodes 118.

As shown in FIGS. 5A and 5B and FIG. 6, the multilayer body 12 in the multilayer ceramic capacitor 110 includes a plurality of inner electrodes 118 including a plurality of first inner electrodes 118a and a plurality of second inner electrodes 118b. Each of the first inner electrodes 118a includes a first opposite electrode portion 20a, which is opposite to the first side surface 12c and the second side surface 12d, and is stacked in the direction in which the first side surface 12c and the second side surface 12d are connected. Each of the second inner electrodes 118b includes a second opposite electrode portion 20b, which is opposite to the first side surface 12c and the second side surface 12d, and is stacked in the direction in which the first side surface 12c and the second side surface 12d are connected. The first inner electrodes 118a and the second inner electrodes 118b are perpendicular or substantially perpendicular to the first main surface 12a and the second main surface 12b. The first inner electrodes 118a and the second inner electrodes 118b are alternately stacked in the multilayer body 12, and the first opposite electrode portion 20a of the first inner electrode 118a and the second opposite electrode portion 20b of the second inner electrode 118b are opposed to each other.

The first inner electrode 118a extends to the second main surface 12b of the multilayer body 12 by a first extending electrode portion 22a and extends to the first main surface 12a of the multilayer body 12 by a first extending electrode portion 23a. The first extending electrode portions 22a and 23a extend to the first end surface 12e side of the multilayer body 12. The second inner electrode 118b extends to the second main surface 12b of the multilayer body 12 by a second extending electrode portion 22b and extends to the first main surface 12a of the multilayer body 12 by a second extending electrode portion 23b. The second extending electrode portion 22b extends to the second end surface 12f side of the multilayer body 12 while maintaining a distance from the first extending electrode portion 22a, and the second extending electrode portion 23b extends to the second end surface 12f side of the multilayer body 12 while maintaining a distance from the first extending electrode portion 23a. Neither the first inner electrode 118a nor the second inner electrode 118b is exposed at the two side surfaces 12c and 12d and the two end surfaces 12e and 12f.

A portion of the first inner electrode 118a may extend to the first end surface 12e, and a portion of the second inner electrode 118b may extend to the second end surface 12f.

The outer electrode 14 is located on the second main surface 12b of the multilayer body 12, and the outer electrode 15 is located on the first main surface 12a of the multilayer body 12. The outer electrode 14 includes a first outer electrode 14a electrically connected to the first extending electrode portions 22a and a second outer electrode 14b electrically connected to the second extending electrode portions 22b. The outer electrode 15 includes a first outer electrode 15a electrically connected to the first extending electrode portions 23a and a second outer electrode 15b electrically connected to the second extending electrode portions 23b.

The first outer electrode 14a includes a first outer electrode main surface portion 24a located on the second main surface 12b, first outer electrode side surface portions 26a that extend from the first outer electrode main surface portion 24a to the first side surface 12c and the second side surface 12d, and a first outer electrode end surface portion 28a that extends from the first outer electrode main surface portion 24a to the first end surface 12e.

The second outer electrode 14b includes a second outer electrode main surface portion 24b located on the second main surface 12b, second outer electrode side surface portions 26b that extend from the second outer electrode main surface portion 24b to the first side surface 12c and the second side surface 12d, and a second outer electrode end surface portion 28b that extends from the second outer electrode main surface portion 24b to the second end surface 12f.

The first outer electrode 15a includes a first outer electrode main surface portion 25a located on the first main surface 12a, first outer electrode side surface portions 27a that extend from the first outer electrode main surface portion 25a to the first side surface 12c and the second side surface 12d, and a first outer electrode end surface portion 29a that extends from the first outer electrode main surface portion 25a to the first end surface 12e.

The second outer electrode 15b includes a second outer electrode main surface portion 25b located on the first main surface 12a, second outer electrode side surface portions 27b that extend from the second outer electrode main surface portion 25b to the first side surface 12c and the second side surface 12d, and a second outer electrode end surface portion 29b that extends from the second outer electrode main surface portion 25b to the second end surface 12f.

The first outer electrode main surface portion 24a of the first outer electrode 14a extends along the first end surface 12e on the second main surface 12b of the multilayer body 12, and the first outer electrode main surface portion 25a of the first outer electrode 15a extends along the first end surface 12e on the first main surface 12a of the multilayer body 12. The second outer electrode main surface portion 24b of the second outer electrode 14b extends along the second end surface 12f while maintaining a distance from the first outer electrode main surface portion 24a, and the second outer electrode main surface portion 25b of the second outer electrode 15b extends along the second end surface 12f while maintaining a distance from the first outer electrode main surface portion 25a.

The lengths of the first outer electrode side surface portions 26a and 27a and the second outer electrode side surface portions 26b and 27b in the direction in which the first main surface 12a and the second main surface 12b are connected are larger than the lengths of the first outer electrode end surface portions 28a and 29a and the second outer electrode end surface portion 28b and 29b in the direction in which the first main surface 12a and the second main surface 12b are connected.

Preferably, about $1.40 \leq A/B \leq$ about $3.33$ is satisfied, for example, where the lengths of the first outer electrode side surface portions 26a and 27a and the second outer electrode side surface portions 26b and 27b in the direction in which the first main surface 12a and the second main surface 12b are connected are indicated as A, and the lengths of the first outer electrode end surface portions 28a and 29a and the second outer electrode end surface portions 28b and 29b in the direction in which the first main surface 12a and the second main surface 12b are connected are indicated as B.

The process for measuring the A dimension and the B dimension is the same or substantially the same as the process described in the first preferred embodiment.

Each of the outer electrodes 14 and 15 preferably includes an underlying electrode layer and a plating layer in this order from the multilayer body 12 side, for example.

The multilayer ceramic capacitor 110 provides the following advantages in addition to the same or similar advantages provided by the above-described multilayer ceramic capacitor 10.

In the multilayer ceramic capacitor 110, the outer electrode 15 is located on the first main surface 12a of the multilayer body 12, and the outer electrode 14 is located on the second main surface 12b. Accordingly, selection of the direction in mounting is unnecessary because either the first main surface 12a side or the second main surface 12b is able to define and function as a mounting surface. Therefore, the multilayer ceramic capacitor 110 is able to be efficiently mounted onto the circuit board.

2. Method for Manufacturing Multilayer Ceramic Electronic Component

Next, a non-limiting example of a method for manufacturing the multilayer ceramic electronic component is described below. The explanation below is provided with respect to the method for manufacturing the multilayer ceramic capacitor 10.

Ceramic green sheets and an electrically conductive paste for the inner electrode are prepared. The ceramic green sheets and the electrically conductive paste for the inner electrode include a binder, for example, an organic binder, and a solvent, for example, an organic solvent.

The ceramic green sheets are printed with predetermined patterns of electrically conductive paste for the inner electrode by employing, for example, screen printing or gravure printing to define inner electrode patterns. Accordingly, inner layer ceramic green sheets printed with the inner electrode patterns are produced. In addition, outer layer ceramic green sheets not printed with the inner electrode pattern are produced.

A predetermined number of outer layer ceramic green sheets not printed with the inner electrode pattern are stacked, the inner layer ceramic green sheets printed with the inner electrode patterns are stacked sequentially on the surface thereof, and a predetermined number of the outer layer ceramic green sheets not printed with the inner electrode pattern are stacked on the surface thereof to produce a multilayer sheet.

The multilayer sheet is pressed in a stacking direction by an isostatic press or the like to produce a multilayer block.

The multilayer block is cut into a predetermined size to produce a multilayer chip. The corner portions and the ridge portions of the multilayer chip may be rounded by employing barreling or the like.

The multilayer chip is fired to produce a multilayer body. The firing temperature is preferably about 900° C. or higher and about 1,300° C. or lower, for example, depending on the ceramic and the material for forming the inner electrode.

The first extending electrode portion 22a of the first inner electrode 18a is exposed at the second main surface 12b of the multilayer body 12. The underlying electrode layer of the first outer electrode 14a is formed to cover the first extending electrode portion 22a of the first inner electrode 18a exposed at the second main surface 12b of the multilayer body 12. The second extending electrode portion 22b of the second inner electrode 18b is exposed at the second main surface 12b of the multilayer body 12. The underlying electrode layer of the second outer electrode 14b is formed to cover the second extending electrode portion 22b of the second inner electrode 18b exposed at the second main surface 12b of the multilayer body 12.

In order to form the underlying electrode layer of the first outer electrode 14a, for example, the exposed portion of the first extending electrode portion 22a of the first inner electrode 18a exposed at the second main surface 12b of the multilayer body 12 is coated with the electrically conductive paste for the outer electrode, and baking is performed. Likewise, in order to form the underlying electrode layer of the second outer electrode 14b, for example, the exposed portion of the second extending electrode portion 22b of the second inner electrode 18b exposed at the second main surface 12b of the multilayer body 12 is coated with the electrically conductive paste for the outer electrode, and baking is performed. The baking temperature is preferably about 700° C. or higher and about 900° C. or lower, for example. As desired, at least one layer of plating film may be formed on the surface of the underlying electrode layer to define the outer electrode 14.

Alternatively, in order to form the underlying electrode layer of the first outer electrode 14a, for example, the exposed portion of the first extending electrode portion 22a of the first inner electrode 18a exposed at the second main surface 12b of the multilayer body 12 may be subjected to a plating treatment. Likewise, in order to form the underlying electrode layer of the second outer electrode 14b, for example, the exposed portion of the second extending electrode portion 22b of the second inner electrode 18b exposed at the second main surface 12b of the multilayer body 12 may be subjected to a plating treatment. When the plating treatment is performed, either electrolytic plating or electroless plating may be performed. One issue with the electroless plating is that a pretreatment, for example, a catalyst or the like, is typically performed to increase the plating deposition rate and, thereby, the steps are complicated. Therefore, the electrolytic plating is usually preferred. Preferably, a barrel plating method is performed as the plating method, for example. If a surface conductor is formed, the surface of the outermost ceramic green sheet may be printed with a surface conductor pattern in advance, and firing may be performed at the same or substantially the same time with the firing of the multilayer body. Alternatively, the main surface of the fired multilayer body may be printed with the surface conductor, and baking may be performed. As desired, at least one layer of plating film may be formed on the surface of the underlying electrode layer to define the outer electrode 14.

The multilayer ceramic capacitor 10 shown in FIG. 1 is produced as described above.

The advantages and features of the obtained multilayer ceramic electronic component will be clarified by the experimental examples described below.

3. Experimental Examples

The experimental examples performed by the inventor for the purpose of examining the advantages and features of the preferred embodiments of present invention are described below.

In the experimental examples, regarding the multilayer ceramic capacitor, the stability of the orientation when the multilayer ceramic capacitor was mounted on a circuit board was evaluated on the basis of the relationship between the lengths of the first outer electrode side surface portions and the second outer electrode side surface portions in the direction in which the first main surface and the second main surface are connected (A dimension) and the lengths of the first outer electrode end surface portion and the second outer electrode end surface portion in the direction in which the first main surface and the second main surface are connected (B dimension).

The specifications of the multilayer ceramic capacitor of each of Sample 1 to Sample 14 are described below. The dimensions of the size and the like were design values. The number of specimens of each Sample was set to be 100.

Size: L×W×T=3.2 mm×1.6 mm×1.6 mm
Material for forming ceramic layer: $BaTiO_3$
Material for forming inner electrode: Ni
Structure of outer electrode:
Baking layer: paste including metal powder (Cu) and glass is applied and baked
Plating layer: two-layer structure including Ni plating layer and Sn plating layer Each specimen was mounted by eutectic or LF solder onto a glass epoxy board defining and functioning as a circuit board. Thereafter, a photograph was taken with a stereomicroscope from the end surface direction of the multilayer ceramic capacitor, and the angle formed by the normal in the direction perpendicular or substantially perpendicular to the circuit board and the parallel or substantially parallel lines of the side surfaces of the multilayer ceramic capacitor was measured. A specimen exhibiting an inclination of about 2.5° or more in the result of the angle measurement was rated as NG.

The appearance of the multilayer ceramic capacitor, which was a specimen of each Sample, was observed by a microscope and the heights of the central portions of the first outer electrode side surface portions and the second outer electrode side surface portions of the multilayer ceramic capacitor in the length direction L (A dimension) and the heights of the central portions of the first outer electrode end surface portion and the second outer electrode end surface portion in the width direction W (B dimension) were measured by a dimension measurement operation. The A dimension was determined as an average of the values of the first outer electrode side surface portions 26a and the values of the second outer electrode side surface portions 26b. The B dimension was determined as an average of the value of the first outer electrode end surface portion 28a and the value of the second outer electrode end surface portion 28b.

The multilayer body 12 was set with the second main surface down. Thus, the first side surface was observed, the normal to the parallel or substantially parallel lines based on the first main surface and the second main surface was formed, and the length of the line, which was parallel or substantially parallel to the normal and which corresponded to the A dimension, was measured. Likewise, the multilayer body 12 was set with the second main surface 12b down. Thus, the first end surface was observed, the normal to the parallel or substantially parallel lines based on the first main surface and the second main surface was formed, and the B dimension, which was parallel or substantially parallel to the normal, was measured.

Table 1 shows A/B of each Sample of Sample 1 to Sample 14 versus the evaluation result of the inclination test. With respect to Sample 1 to Sample 7, results were obtained while the A dimension was fixed to 0.128 mm, and with respect to Sample 8 to Sample 14, results were obtained while the A dimension was fixed to 0.600 mm. Asterisked Samples were out of the range of the preferred embodiments of the present invention.

TABLE 1

| | A dimension (mm) | B dimension (mm) | A/B | Inclination test |
|---|---|---|---|---|
| *Sample 1 | 0.128 | 0.13 | 0.98 | NG (6/100) |
| *Sample 2 | 0.128 | 0.11 | 1.16 | NG (6/100) |
| Sample 3 | 0.128 | 0.09 | 1.42 | G (0/100) |
| Sample 4 | 0.128 | 0.07 | 1.83 | G (0/100) |
| Sample 5 | 0.128 | 0.05 | 2.56 | G (0/100) |
| Sample 6 | 0.128 | 0.04 | 3.20 | G (0/100) |
| *Sample 7 | 0.128 | 0.03 | 4.27 | NG (3/100) |
| *Sample 8 | 0.600 | 0.65 | 0.92 | NG (6/100) |
| *Sample 9 | 0.600 | 0.58 | 1.03 | NG (6/100) |
| Sample 10 | 0.600 | 0.43 | 1.40 | G (0/100) |
| Sample 11 | 0.600 | 0.25 | 2.40 | G (0/100) |
| Sample 12 | 0.600 | 0.18 | 3.33 | G (0/100) |
| *Sample 13 | 0.600 | 0.12 | 5.00 | NG (2/100) |
| *Sample 14 | 0.600 | 0.10 | 6.00 | NG (3/100) |

As shown in the above-described results, regarding Sample 3 to Sample 6 and Sample 10 to Sample 12, the height of the outer electrode side surface portion (A dimension) was set to be higher than the height of the outer electrode end surface portion (B dimension), about $1.40 \leq A/B \leq$ about $3.33$ was satisfied and, thereby, the down force applied at four positions of the outer electrode side surface portions of the side surfaces increased, the effect was increased compared with the down force applied at two positions of the outer electrode end surface portions of the end surfaces, no specimen was rated as NG, and the inclination in mounting was significantly reduced.

It was determined that, because the length of the outer electrode side surface portion in the direction in which the first main surface and the second main surface are connected (A dimension) is longer than the length of the outer electrode end surface portion in the direction in which the first main surface and the second main surface are connected (B dimension), the mounting orientation is determined by the down force, which is applied during melting of a joining material during mounting, exerted on the multilayer ceramic capacitor. Also, it was determined that the down force is influenced by the height of the electrode opposite to the mounting surface and, therefore, the end surface or the side surface, which includes a higher electrode height, determines the mounting orientation.

On the other hand, regarding each of Sample 1, Sample 2, Sample 7, Sample 8, Sample 9, Sample 13, and Sample 14, some specimens were rated as NG.

The present invention is not limited to the above-described preferred embodiments.

While preferred embodiments of the invention have been described above, it is to be understood that variations and modifications will be apparent to those skilled in the art without departing from the scope and spirit of the present invention. The scope of the invention, therefore, is to be determined solely by the following claims.

What is claimed is:

1. A multilayer ceramic electronic component comprising:
a multilayer body including a plurality of stacked ceramic layers, a first main surface and a second main surface opposite to each other, a first side surface and a second side surface opposite to each other in a stacking direction, and a first end surface and a second end surface opposite to each other, the first main surface or the second main surface defining and functioning as a mounting surface;
first inner electrodes, which are located inside the multilayer body and a portion of each of which extends to only one surface of the first and second main surfaces on the first end surface side;
second inner electrodes, which are located inside the multilayer body and a portion of each of which extends to only one surface of the first and second main surfaces on the second end surface side, at a location different from the locations of the first inner electrodes;
a first outer electrode located on the first or second main surface and connected to the first inner electrodes; and
a second outer electrode located on the first or second main surface and connected to the second inner electrodes; wherein
the first outer electrode includes first outer electrode side surface portions located from the first or second main surface to a portion of each of the first side surface and the second side surface and a first outer electrode end surface portion located from the first or second main surface to a portion of the first end surface;
the second outer electrode includes second outer electrode side surface portions located from the first or second main surface to a portion of each of the first side surface and the second side surface and a second outer electrode end surface portion located from the first or second main surface to a portion of the second end surface; and
$1.40 \leq A/B \leq 3.33$ is satisfied, where lengths of the first outer electrode side surface portions and the second outer electrode side surface portions in the direction in which the first main surface and the second main surface are connected are indicated as A and lengths of the first outer electrode end surface portion and the second outer electrode end surface portion in the direction in which the first main surface and the second main surface are connected are indicated as B.

2. The multilayer ceramic electronic component according to claim 1, wherein the stacked ceramic layers include a dielectric material.

3. The multilayer ceramic electronic component according to claim 1, wherein the stacked ceramic layers include a piezoelectric ceramic, and the multilayer ceramic electronic component defines and functions as a ceramic piezoelectric element.

4. The multilayer ceramic electronic component according to claim 1, wherein the stacked ceramic layers include a semiconductor ceramic, and the multilayer ceramic electronic component defines and functions as a thermistor element.

5. The multilayer ceramic electronic component according to claim 1, wherein the stacked ceramic layers include a magnetic ceramic, and the multilayer ceramic electronic component defines and functions as an inductor element.

6. The multilayer ceramic electronic component according to claim 1, wherein at least one gap is provided in the multilayer body between the first end surface and the second end surface.

7. The multilayer ceramic electronic component according to claim 1, wherein the first outer electrode and the second outer electrode include an underlying electrode layer and a plating layer.

8. The multilayer ceramic electronic component according to claim 7, wherein the underlying electrode layer includes at least one of a baking layer, a resin layer, and a thin film layer.

9. The multilayer ceramic electronic component according to claim 7, wherein the plating layer includes a two-layer structure.

10. The multilayer ceramic electronic component according to claim 1, wherein the multilayer body includes ceramic green sheets printed with predetermined patterns of electrically conductive paste.

11. A multilayer ceramic electronic component comprising:
- a multilayer body including a plurality of stacked ceramic layers, a first main surface and a second main surface opposite to each other, a first side surface and a second side surface opposite to each other in a stacking direction, and a first end surface and a second end surface opposite to each other, the first main surface or the second main surface defining and functioning as a mounting surface;
- first inner electrodes, which are located inside the multilayer body and a portion of each of which extends to the first and second main surfaces on the first end surface side;
- second inner electrodes, which are located inside the multilayer body and a portion of each of which extends to the first and second main surfaces on the second end surface side, at locations different from the locations of the first inner electrodes;
- first outer electrodes located on the first and second main surfaces and connected to the first inner electrodes; and
- second outer electrodes located on the first and second main surfaces and connected to the second inner electrodes; wherein
- each of the first outer electrodes includes first outer electrode side surface portions located from the first or second main surface to a portion of each of the first side surface and the second side surface and a first outer electrode end surface portion located from the first or second main surface to a portion of the first end portion;
- each of the second outer electrodes includes second outer electrode side surface portions located from the first or second main surface to a portion of each of the first side surface and the second side surface and a second outer electrode end surface portion located from the first or second main surface to a portion of the second end surface; and
- $1.40 \leq A/B \leq 3.33$ is satisfied, where lengths of the first outer electrode side surface portions and the second outer electrode side surface portions in the direction in which the first main surface and the second main surface are connected are indicated as A and lengths of the first outer electrode end surface portions and the second outer electrode end surface portions in the direction in which the first main surface and the second main surface are connected are indicated as B.

12. The multilayer ceramic electronic component according to claim 11, wherein the stacked ceramic layers include a dielectric material.

13. The multilayer ceramic electronic component according to claim 11, wherein the stacked ceramic layers include a piezoelectric ceramic, and the multilayer ceramic electronic component defines and functions as a ceramic piezoelectric element.

14. The multilayer ceramic electronic component according to claim 11, wherein the stacked ceramic layers include a semiconductor ceramic, and the multilayer ceramic electronic component defines and functions as a thermistor element.

15. The multilayer ceramic electronic component according to claim 11, wherein the stacked ceramic layers include a magnetic ceramic, and the multilayer ceramic electronic component defines and functions as an inductor element.

16. The multilayer ceramic electronic component according to claim 11, wherein at least one gap is provided in the multilayer body between the first end surface and the second end surface.

17. The multilayer ceramic electronic component according to claim 11, wherein the first outer electrode and the second outer electrode include an underlying electrode layer and a plating layer.

18. The multilayer ceramic electronic component according to claim 17, wherein the underlying electrode layer includes at least one of a baking layer, a resin layer, and a thin film layer.

* * * * *